(12) United States Patent
Truffa et al.

(10) Patent No.: US 12,679,997 B2
(45) Date of Patent: Jul. 14, 2026

(54) AMINE-BASED COMPOSITIONS FOR USE IN CMP WITH HIGH POLYSILICON RATE

(71) Applicant: CMC MATERIALS LLC, Aurora, IL (US)

(72) Inventors: Julianne Truffa, Aurora, IL (US); Brittany Johnson, Aurora, IL (US); Alexander W. Hains, Aurora, IL (US); Elliot Knapton, Aurora, IL (US); Brian Reiss, Aurora, IL (US)

(73) Assignee: CMC MATERIALS LLC, Aurora, IL (US)

( * ) Notice: Subject to any disclaimer, the term of this patent is extended or adjusted under 35 U.S.C. 154(b) by 806 days.

(21) Appl. No.: 17/985,021

(22) Filed: Nov. 10, 2022

(65) Prior Publication Data

US 2024/0166915 A1     May 23, 2024

(51) Int. Cl.
C09G 1/02 (2006.01)
H10P 52/40 (2026.01)

(52) U.S. Cl.
CPC .............. C09G 1/02 (2013.01); H10P 52/402 (2026.01); H10P 52/403 (2026.01)

(58) Field of Classification Search
None
See application file for complete search history.

(56) References Cited

U.S. PATENT DOCUMENTS

| | | | |
|---|---|---|---|
| 2004/0186206 A1 | 9/2004 | Yoneda | |
| 2006/0117666 A1* | 6/2006 | Yoshida | ............... C09K 3/1463 |
| | | | 451/41 |
| 2006/0118760 A1* | 6/2006 | Yang | ......................... C23F 3/04 |
| | | | 216/88 |
| 2011/0250755 A1* | 10/2011 | Morinaga | ............. B24B 37/042 |
| | | | 438/693 |
| 2013/0244433 A1 | 9/2013 | Reiss | |
| 2020/0157422 A1 | 5/2020 | Liu | |
| 2022/0306901 A1 | 9/2022 | Mae | |

FOREIGN PATENT DOCUMENTS

| | | |
|---|---|---|
| JP | 2015120828 A | 7/2015 |
| WO | 2018147148 A1 | 8/2018 |

* cited by examiner

*Primary Examiner* — Roberts P Culbert

(57) ABSTRACT

The invention provides a chemical-mechanical polishing composition comprising: (a) silica abrasive; (b) an amine-based compound, wherein the amine-based compound comprises a carbon to nitrogen ratio of about 1:1 to about 3:1; (c) optionally a buffer; and (d) water, wherein the polishing composition has a pH of about 9 to about 12. The invention also provides a method of chemically-mechanically polishing a substrate, especially a substrate comprising polysilicon, using the inventive polishing composition.

13 Claims, 1 Drawing Sheet

PolySi Removal Rate vs. Amine-Based Compound Molecular Weight

PolySi Removal Rate vs. Amine-Based Compound Molecular Weight
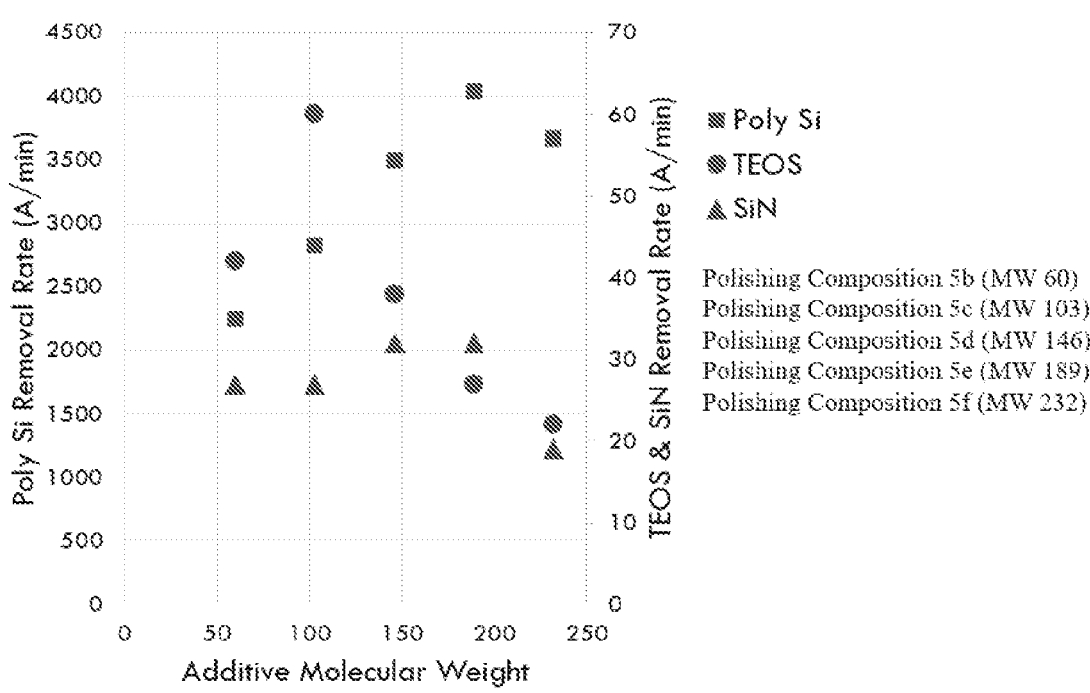

AMINE-BASED COMPOSITIONS FOR USE IN CMP WITH HIGH POLYSILICON RATE

BACKGROUND OF THE INVENTION

In the fabrication of integrated circuits and other electronic devices (e.g., micro-electro-mechanical systems (MEMS) fabrication), multiple layers of conducting, semi-conducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features on a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

As the size of integrated circuits is reduced and the number of integrated circuits on a chip increases, the components that make up the circuits must be positioned closer together in order to comply with the limited space available on a typical chip. Effective isolation between circuits is important for ensuring optimum semiconductor performance. To that end, shallow trenches are etched into the semiconductor substrate and filled with insulating material to isolate active regions of the integrated circuit. Due to variation in the depth of trenches formed in this manner, it is typically necessary to deposit an excess of dielectric material on top of the substrate to ensure complete filling of all trenches. The dielectric material conforms to the underlying topography of the substrate.

In some applications, polycrystalline silicon (also referred to in the art as polysilicon, poly-Si, or poly) films can be used in preparation of integrated circuits and MEMS devices. For example, polysilicon can be used as a gate electrode material in metal oxide semiconductors (MOS) and metal oxide semiconductor field-effect transistors (MOSFET). In addition, polysilicon is also commonly used in various damascene/interconnect applications in IC devices as well as in structural components in MEMS devices.

In such applications, there is a real need for polysilicon CMP compositions that provide high polysilicon removal rates, as well as high polysilicon selectivity to silicon oxide and silicon nitride layers. While there are commercially available CMP compositions that provide adequate polysilicon removal rates, these conventionally used polysilicon CMP compositions (i) require hazardous materials such as tetramethylammonium hydroxide (TMAH) to increase the rate of polysilicon removal and/or (ii) produce high levels of surface defectivities and scratches.

Thus, a need remains for polysilicon CMP compositions and methods for chemical-mechanical polishing that can exhibit high polysilicon removal rates, as well as high selectivity to silicon oxide and silicon nitride layers, and are capable of limiting the amount surface defectivities and scratches.

The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising: (a) silica abrasive; (b) an amine-based compound, wherein the amine-based compound comprises a carbon to nitrogen ratio of about 1:1 to about 3:1; (c) optionally a buffer; and (d) water, wherein the polishing composition has a pH of about 9 to about 12.

The invention further provides a method of chemically-mechanically polishing a substrate comprising: (i) providing a substrate, (ii) providing a polishing pad, (iii) providing a chemical-mechanical polishing composition comprising: (a) silica abrasive; (b) an amine-based compound, wherein the amine-based compound comprises a carbon to nitrogen ratio of about 1:1 to about 3:1; (c) optionally a buffer; and (d) water, wherein the polishing composition has a pH of about 9 to about 12, (iv) contacting the substrate with the polishing pad and the chemical-mechanical polishing composition, and (v) moving the polishing pad and the chemical-mechanical polishing composition relative to the substrate to abrade at least a portion of a surface of the substrate to thereby polish the substrate.

BRIEF DESCRIPTION OF THE DRAWINGS

FIG. 1 is a graph showing the effect of the molecular weight (MW) of an amine-based compound on the polySi removal rate (Å/min), TEOS removal rate (Å/min), and SiN removal rate for Polishing Compositions 5B-5F, as described in Example 5.

DETAILED DESCRIPTION OF THE INVENTION

The invention provides a chemical-mechanical polishing composition comprising, consisting essentially of, or consisting of: (a) silica abrasive; (b) an amine-based compound, wherein the amine-based compound comprises a carbon to nitrogen ratio of about 1:1 to about 3:1; (c) optionally a buffer; and (d) water, wherein the polishing composition has a pH of about 9 to about 12.

The polishing composition comprises a silica abrasive. As used herein, the terms "silica abrasive," "silica abrasive particle," "silica particle," and "abrasive particle" can be used interchangeably, and can refer to any silica particle (e.g., colloidal silica particle). The silica can be of any suitable form such as wet-process type silica, fumed silica, or combinations thereof. For example, the silica can comprise wet-process type silica particles (e.g., condensation-polymerized or precipitated silica particles).

The silica abrasive (e.g., colloidal silica particles) can be prepared by various methods, some examples of which are commercially used and known. Useful silica abrasive particles include precipitated or condensation-polymerized silica, which may be prepared using known methods, such as by methods referred to as the "sol gel" method or by silicate ion-exchange. Condensation-polymerized silica particles are often prepared by condensing $Si(OH)_4$ to form substantially spherical (e.g., spherical, ovular, or oblong) particles. The precursor $Si(OH)_4$ may be obtained, for example, by hydrolysis of high purity alkoxysilanes, or by acidification of aqueous silicate solutions. U.S. Pat. No. 5,230,833 describes a method for preparing colloidal silica particles in solution.

In some embodiments, the silica abrasive is a colloidal silica particle. As known to one of ordinary skill in the art, colloidal silicas are suspensions of fine amorphous, nonporous and typically spherical particles in a liquid phase. The colloidal silica can take the form of condensation-polymerized or precipitated silica particles. In some embodiments, the silica is in the form of wet-process type silica particles. The particles, e.g., colloidal silica, can have any suitable average size (i.e., average particle diameter). If the average abrasive particle size is too small, the polishing composition may not exhibit sufficient removal rate. In contrast, if the average abrasive particle size is too large, the polishing composition may exhibit undesirable polishing performance such as, for example, poor substrate defectivity. Such colloidal silica particles may be aggregated or non-aggregated. Non-aggregated particles are individually discrete particles that may be spherical or nearly spherical in shape, but can have other shapes as well (such as generally elliptical, square, or rectangular cross-sections). Aggregated particles are particles in which multiple discrete particles are clustered or bonded together to form aggregates having generally irregular shapes.

In some embodiments, the silica abrasive is a pyrogenic silica particle. Pyrogenic silica (also referred to as fumed silica) is produced via a flame hydrolysis process in which a suitable feedstock vapor (such as silicon tetra-chloride) is combusted in a flame of hydrogen and oxygen. Molten particles of roughly spherical shapes are formed in the combustion process, the diameters of which may be varied via process parameters. These molten spheres, commonly referred to as primary particles, fuse with one another by undergoing collisions at their contact points to form branched, three dimensional chain-like aggregates. Fumed silica abrasives are commercially available from a number of suppliers including, for example, Cabot Corporation, Evonic, and Wacker Chemie.

The silica abrasive (e.g., colloidal silica particle) can be modified (e.g., surface modified) or unmodified, and have a negative native zeta potential or a positive native zeta potential. As used herein, the phrase "native zeta potential" refers to the zeta potential of the silica abrasive prior to adding the silica abrasive to the polishing composition. For example, the native zeta potential can refer to the zeta potential of a silica abrasive prior to adding the silica abrasive to the polishing composition as measured in a neutral (i.e., pH of about 7) aqueous solution.

A skilled artisan will be able to determine whether the silica abrasive, prior to adding the silica abrasive to the polishing composition, has a negative native zeta potential or a positive native zeta potential. The charge on dispersed particles such as a silica abrasive (e.g., colloidal silica particles) is commonly referred to as the zeta potential (or the electrokinetic potential). The zeta potential of a particle refers to the electrical potential difference between the electrical charge of the ions surrounding the particle and the electrical charge of the bulk solution of the composition in which it is measured (e.g., the liquid carrier and any other components dissolved therein). The zeta potential is typically dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The native zeta potential and the zeta potential of the polishing composition may be obtained using the Model DT-1202 Acoustic and Electro-acoustic spectrometer available from Dispersion Technologies, Inc. (Bedford Hills, N.Y.). As used herein, the phrase "negative zeta potential" refers to a silica abrasive that exhibits a negative surface charge when measured in the polishing composition. As used herein, the phase "positive zeta potential" refers to a silica abrasive that exhibits a positive surface charge when measured in the polishing composition.

The silica abrasive (i.e., silica abrasive particles) can have any suitable particle size. The particle size of a particle suspended in a liquid carrier may be defined in the industry using various means. For example, the particle size may be defined as the diameter of the smallest sphere that encompasses the particle and may be measured using a number of commercially available instruments, for example, including the CPS Disc Centrifuge, Model DC24000HR (available from CPS Instruments, Prairieville, La.) or the Zetasizer® available from Malvern Instruments®. Such instruments generally report an average particle size for a silica dispersion.

Accordingly, the silica abrasive (e.g., silica particles or colloidal silica particles) can have an average particle diameter of about 10 nm or more, e.g., about 15 nm or more, about 20 nm or more, about 25 nm or more, about 30 nm or more, about 35 nm or more, about 40 nm or more, about 45 nm or more, about 50 nm or more, about 60 nm or more, about 70 nm or more, or about 80 nm or more. Alternatively, or in addition, the silica abrasive can have an average particle diameter of about 200 nm or less, e.g., about 175 nm or less, about 150 nm or less, about 140 nm or less, about 130 nm or less, about 125 nm or less, about 120 nm or less, about 110 nm or less, about 100 nm or less, about 75 nm or less, about 50 nm or less, or about 40 nm or less. Thus, the silica abrasive can have an average particle diameter bounded by any two of the aforementioned endpoints.

For example, in some embodiments, the silica abrasive (e.g., silica particles or colloidal silica particles) can have an average particle diameter of about 10 nm to about 200 nm, e.g., about 10 nm to about 175 nm, about 10 nm to about 150 nm, about 10 nm to about 140 nm, about 10 nm to about 130 nm, about 10 nm to about 125 nm, about 10 nm to about 120 nm, about 10 nm to about 110 nm, about 10 nm to about 100 nm, about 10 nm to about 75 nm, about 10 nm to about 50 nm, about 10 nm to about 40 nm, about 20 nm to about 200 nm, about 20 nm to about 175 nm, about 20 nm to about 150 nm, about 20 nm to about 140 nm, about 20 nm to about 130 nm, about 20 nm to about 125 nm, about 20 nm to about 120 nm, about 20 nm to about 110 nm, about 20 nm to about 100 nm, about 20 nm to about 75 nm, about 20 nm to about 50 nm, about 20 nm to about 40 nm, about 30 nm to about 200 nm, about 30 nm to about 175 nm, about 30 nm to about 150 nm, about 30 nm to about 140 nm, about 30 nm to about 130 nm, about 30 nm to about 125 nm, about 30 nm to about 120 nm, about 30 nm to about 110 nm, about 30 nm to about 100 nm, about 30 nm to about 75 nm, about 30 nm to about 50 nm, about 30 nm to about 40 nm, about 40 nm to about 200 nm, about 40 nm to about 175 nm, about 40 nm to about 150 nm, about 40 nm to about 140 nm, about 40 nm to about 130 nm, about 40 nm to about 125 nm, about 40 nm to about 120 nm, about 40 nm to about 110 nm, about 40 nm to about 100 nm, about 40 nm to about 75 nm, about 40 nm to about 50 nm, about 50 nm to about 200 nm, about 50 nm to about 175 nm, about 50 nm to about 150 nm, about 50 nm to about 140 nm, about 50 nm to about 130 nm, about 50 nm to about 125 nm, about 50 nm to about 120 nm, about 50 nm to about 110 nm, about 50 nm to about 100 nm, about 50 nm to about 75 nm, about 60 nm to about 200 nm, about 60 nm to about 175 nm, about 60 nm to about 150 nm, about 60 nm to about 140 nm, about 60 nm to about 130 nm, about 60 nm to about 125 nm, about 60 nm to about 120 nm, about 60 nm to about 110 nm, about 60 nm to about 100 nm, about 60 nm to about 75 nm, about 70 nm to about 200 nm, about 70 nm to about 175 nm, about 70 nm to about 150 nm, about 70 nm to about 140 nm, about 70 nm to about 130 nm, about 70 nm to about 125 nm, about 70 nm to about 120 nm, about 70 nm to about 110 nm, about 70 nm to about 100 nm, about 80 nm to about 200 nm, about 80 nm to about 175 nm, about 80 nm to about 150 nm, about 80 nm to about 140 nm, about 80 nm to about 130 nm, about 80 nm to about 125 nm, about 80 nm to about 120 nm, about 80 nm to about 110 nm, or about 80 nm to about 100 nm.

The silica abrasive (e.g., silica particles or colloidal silica particles) preferably are colloidally stable in the polishing composition. The term colloid refers to the suspension of particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., {[B]–[T]}/[C]≤0.5). More preferably, the value of [B]–[T]/[C] is less than or equal to 0.3, and most preferably is less than or equal to 0.1.

The polishing composition can comprise any suitable amount of silica abrasive. If the polishing composition of the invention comprises too little abrasive, the composition may not exhibit sufficient removal rate. In contrast, if the polishing composition comprises too much abrasive then the polishing composition may exhibit undesirable polishing performance and/or may not be cost effective and/or may lack stability. The polishing composition can comprise about 10 wt. % or less of silica abrasive, e.g., about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less, or about 0.5 wt. % or less of the silica abrasive. Alternatively, or in addition, the polishing composition can comprise about 0.001 wt. % or more of silica abrasive, e.g., about 0.005 wt. % or more, about 0.01 wt. % or more, about 0.05 wt. % or more, about 0.1 wt. % or more, about 0.2 wt. % or more, about 0.3 wt. % or more, about 0.4 wt. % or more, or about 0.5 wt. % or more. Thus, the polishing composition can comprise silica abrasive in an amount bounded by any two of the afore-mentioned endpoints, as appropriate.

For example, in some embodiments, the polishing composition can comprise about 0.001 wt. % to about 10 wt. % of silica abrasive, e.g., about 0.001 wt. % to about 8 wt. %, about 0.001 wt. % to about 6 wt. %, about 0.001 wt. % to about 5 wt. %, about 0.001 wt. % to about 4 wt. %, about 0.001 wt. % to about 2 wt. %, about 0.001 wt. % to about 1 wt. %, about 0.01 wt. % to about 10 wt. %, about 0.01 wt. % to about 8 wt. %, about 0.01 wt. % to about 6 wt. %, about 0.01 wt. % to about 5 wt. %, about 0.01 wt. % to about 4 wt. %, about 0.01 wt. % to about 2 wt. %, about 0.01 wt. % to about 1 wt. %, about 0.05 wt. % to about 10 wt. %, about 0.05 wt. % to about 8 wt. %, about 0.05 wt. % to about 6 wt. %, about 0.05 wt. % to about 5 wt. %, about 0.05 wt. % to about 4 wt. %, about 0.05 wt. % to about 2 wt. %, about 0.05 wt. % to about 1 wt. %, about 0.1 wt. % to about 10 wt. %, about 0.1 wt. % to about 8 wt. %, about 0.1 wt. % to about 6 wt. %, about 0.1 wt. % to about 5 wt. %, about 0.1 wt. % to about 4 wt. %, about 0.1 wt. % to about 2 wt. %, about 0.1 wt. % to about 1 wt. %, about 0.5 wt. % to about 10 wt. %, about 0.5 wt. % to about 8 wt. %, about 0.5 wt. % to about 5 wt. %, about 0.5 wt. % to about 4 wt. %, about 0.5 wt. % to about 2 wt. %, or about 0.5 wt. % to about 1 wt. %. In some embodiments, the polishing composition comprises about 0.001 wt. % to about 8 wt. % (e.g., about 0.5 wt. % to about 8 wt. %) of silica abrasive. In certain embodiments, the polishing composition comprises about 0.001 wt. % to about 5 wt. % (e.g., about 0.5 wt. % to about 5 wt. %) of silica abrasive. In other embodiments, the polishing composition comprises about 0.001 wt. % to about 3 wt. % (e.g., about 0.5 wt. % to about 3 wt. %) of silica abrasive.

The polishing composition comprises an amine-based compound, wherein the amine-based compound comprises a carbon to nitrogen ratio of about 1:1 to about 3:1. For example, the amine-based compound can have a carbon to nitrogen ratio of about 1.1:1 to about 3:1, about 1.2:1 to about 3:1, about 1.3:1 to about 3:1, about 1.4:1 to about 3:1, about 1.5:1 to about 3:1, about 1.6:1 to about 3:1, about 1.7:1 to about 3:1, about 1.8:1 to about 3:1, about 1.9:1 to about 3:1, about 2:1 to about 3:1, 2.1:1 to about 3:1, about 2.2:1 to about 3:1, about 2.3:1 to about 3:1, about 2.4:1 to about 3:1, about 2.5:1 to about 3:1, about 2.6:1 to about 3:1, about 2.7:1 to about 3:1, about 2.8:1 to about 3:1, about 2.9:1 to about 3:1, about 1:1 to about 2.9:1, about 1:1 to about 2.8:1, about 1:1 to about 2.7:1, about 1:1 to about 2.6:1, about 1:1 to about 2.5:1, about 1:1 to about 2.4:1, about 1:1 to about 2.3:1, about 1:1 to about 2.2:1, about 1:1 to about 2.1:1, about 1:1 to about 2:1, 1:1 to about 1.9:1, about 1:1 to about 1.8:1, about 1:1 to about 1.7:1, about 1:1 to about 1.6:1, about 1:1 to about 1.5:1, about 1:1 to about 1.4:1, about 1:1 to about 1.3:1, about 1:1 to about 1.2:1, about 1:1 to about 1.1:1, about 1.2:1 to about 1.5:1, about 1.2:1 to about 1.8:1, about 1.5:1 to about 2.5:1, about 1.8:1 to about 2.2:1, 2.2:1 to about 2.5:1, or about 2.2:1 to about 2.8:1. In some embodiments, the amine-based compound comprises a carbon to nitrogen ratio of about 1:1 to about 2:1. In certain embodiments, the amine-based compound comprises a carbon to nitrogen ratio of about 1.2:1 to about 1.8:1. In other embodiments, the amine-based compound comprises a carbon to nitrogen ratio of about 2:1 to about 3:1.

As used herein, the term "amine-based compound" refers to any compound comprising a primary amine, a secondary amine, a tertiary amine, or a combination thereof, wherein the amine-based compound does not contain a higher order functional group such as an aldehyde, a ketone, an imine, a carboxylic acid, an amide, a carbonate, a carbamate, or a urea. The amine-based compound can further comprise a hydroxyl group or an ether group; however, in certain embodiments, the amine-based compound consists of carbon, nitrogen, and hydrogen atoms. In preferred embodiments, the amine-based compound comprises at least one primary amine, secondary amine, or a combination thereof.

In some embodiments, the amine-based compound comprises at least one ethylenediamine subunit. In that regard, the amine-based compound can comprise one or more subunits of the formula:

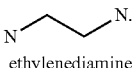

ethylenediamine

It will be understood to a person of ordinary skill in the art that the nitrogen atoms of the ethylenediamine subunit can be shared by more than one ethylenediamine subunit. For example, piperazine and diethylenetriamine each have two ethylenediamine subunits, whereas tetraethylenepentamine has four ethylenediamine subunits. In certain embodiments, the amine-based compound comprises at least two ethylenediamine subunits. In other embodiments, the amine-based compound comprises at least three ethylenediamine subunits. Thus, the amine-based compound can comprise one ethylenediamine subunit, two ethylenediamine subunits, three ethylenediamine subunits, four ethylenediamine subunits, five ethylenediamine subunits, six ethylenediamine subunits, seven ethylenediamine subunits, eight ethylenediamine subunits, nine ethylenediamine subunits, or more.

For example, the amine-based compound can be selected from ethylenediamine, diethylenetriamine, triethylenetetramine, tetraethylenepentamine, pentaethylenehexamine, hexaethyleneheptamine, heptaethyleneoctylamine, octaethylenenonylamine, tris(2-aminoethyl)amine, piperazine, homopiperazine, N,N-diethylethylenediamine, 1,3-diamino-2-propanol, N,N,N',N'',N''-pentamethyldiethylenetriamine, N,N'-dimethylethylenediamine, N,N-dimethylethylenediamine, 1-(2-aminoethyl)piperazine, 1,4-bis(3-aminopropyl)piperazine, aminoethylpiperazine, and combinations thereof. In some embodiments, the amine-based compound is a linear compound comprising ethylenediamine subunits selected from ethylenediamine, diethylenetriamine, triethylenetetramine, tetraethylenepentamine, pentaethylenehexamine, hexaethyleneheptamine, heptaethyleneoctylamine, and octaethylenenonylamine. In other embodiments, the amine-based compound is tris(2-aminoethyl)-amine.

The amine-based compound can have any suitable molecular weight (g/mol). The amine-based compound can have a molecular weight of about 1000 g/mol or less, e.g., about 800 g/mol or less, about 600 g/mol or less, about 500 g/mol or less, about 450 g/mol or less, about 400 g/mol or less, about 350 g/mol or less, about 300 g/mol or less, about 250 g/mol or less, or about 200 g/mol or less. Alternatively, or in addition, the amine-based compound can have a molecular weight of about 60 g/mol or more, e.g., about 80 g/mol or more, about 100 g/mol or more, about 120 g/mol or more, about 140 g/mol or more, about 160 g/mol or more, about 180 g/mol or more, or about 200 g/mol or more. Thus, the amine-based compound can have a molecular weight bounded by any two of the aforementioned endpoints, as appropriate.

For example, in some embodiments, the amine-based compound can have a molecular weight of about 60 g/mol to about 1000 g/mol, e.g., about 80 g/mol to about 1000 g/mol, about 100 g/mol to about 1000 g/mol, about 120 g/mol to about 1000 g/mol, about 140 g/mol to about 1000 g/mol, about 160 g/mol to about 1000 g/mol, about 180 g/mol to about 1000 g/mol, about 200 g/mol to about 1000 g/mol, about 60 g/mol to about 800 g/mol, about 80 g/mol to about 800 g/mol, about 100 g/mol to about 800 g/mol, about 120 g/mol to about 800 g/mol, about 140 g/mol to about 800 g/mol, about 160 g/mol to about 800 g/mol, about 180 g/mol to about 800 g/mol, about 200 g/mol to about 800 g/mol, about 60 g/mol to about 600 g/mol, about 80 g/mol to about 600 g/mol, about 100 g/mol to about 600 g/mol, about 120 g/mol to about 600 g/mol, about 140 g/mol to about 600 g/mol, about 160 g/mol to about 600 g/mol, about 180 g/mol to about 600 g/mol, about 200 g/mol to about 600 g/mol, about 60 g/mol to about 500 g/mol, about 80 g/mol to about 500 g/mol, about 100 g/mol to about 500 g/mol, about 120 g/mol to about 500 g/mol, about 140 g/mol to about 500 g/mol, about 160 g/mol to about 500 g/mol, about 180 g/mol to about 500 g/mol, about 200 g/mol to about 500 g/mol, about 60 g/mol to about 450 g/mol, about 80 g/mol to about 450 g/mol, about 100 g/mol to about 450 g/mol, about 120 g/mol to about 450 g/mol, about 140 g/mol to about 450 g/mol, about 160 g/mol to about 450 g/mol, about 180 g/mol to about 450 g/mol, about 200 g/mol to about 450 g/mol, about 60 g/mol to about 400 g/mol, about 80 g/mol to about 400 g/mol, about 100 g/mol to about 400 g/mol, about 120 g/mol to about 400 g/mol, about 140 g/mol to about 400 g/mol, about 160 g/mol to about 400 g/mol, about 180 g/mol to about 400 g/mol, about 200 g/mol to about 400 g/mol, about 60 g/mol to about 350 g/mol, about 80 g/mol to about 350 g/mol, about 100 g/mol to about 350 g/mol, about 120 g/mol to about 350 g/mol, about 140 g/mol to about 350 g/mol, about 160 g/mol to about 350 g/mol, about 180 g/mol to about 350 g/mol, about 200 g/mol to about 350 g/mol, about 60 g/mol to about 300 g/mol, about 80 g/mol to about 300 g/mol, about 100 g/mol to about 300 g/mol, about 120 g/mol to about 300 g/mol, about 140 g/mol to about 300 g/mol, about 160 g/mol to about 300 g/mol, about 180 g/mol to about 300 g/mol, about 200 g/mol to about 300 g/mol, about 60 g/mol to about 250 g/mol, about 80 g/mol to about 250 g/mol, about 100 g/mol to about 250 g/mol, about 120 g/mol to about 250 g/mol, about 140 g/mol to about 250 g/mol, about 160 g/mol to about 250 g/mol, about 180 g/mol to about 250 g/mol, about 200 g/mol to about 250 g/mol, about 60 g/mol to about 200 g/mol, about 80 g/mol to about 200 g/mol, about 100 g/mol to about 200 g/mol, about 120 g/mol to about 200 g/mol, about 140 g/mol to about 200 g/mol, about 160 g/mol to about 200 g/mol, or about 180 g/mol to about 200 g/mol. In some embodiments, the amine-based compound has a molecular weight of about 80 g/mol to about 400 g/mol. In certain embodiments, the amine-based compound has a molecular weight of about 100 g/mol to about 300 g/mol. In other embodiments, the amine-based compound has a molecular weight of about 120 g/mol to about 250 g/mol.

The amine-based compound can be present in the polishing composition in any suitable amount. The polishing composition can comprise about 5000 ppm or less of the amine-based compound, e.g., about 4000 ppm or less, about 3000 ppm or less, about 2000 ppm or less, about 1000 ppm or less, or about 500 ppm or less. Alternatively, or in addition, the polishing composition can comprise about 50 ppm or more of the amine-based compound, e.g., about 100 ppm or more, about 200 ppm or more, about 300 ppm or more, about 400 ppm or more, or about 500 ppm or more. Thus, the polishing composition can comprise the amine-based compound in an amount bounded by any two of the aforementioned endpoints, as appropriate.

For example, in some embodiments, the amine-based compound can be present in the polishing composition in an amount of about 50 ppm to about 5000 ppm, e.g., about 50 ppm to about 4000 ppm, about 50 ppm to about 3000 ppm, about 50 ppm to about 2000 ppm, about 50 ppm to about 1000 ppm, about 50 ppm to about 500 ppm, about 100 ppm to about 5000 ppm, about 100 ppm to about 4000 ppm, about 100 ppm to about 3000 ppm, about 100 ppm to about 2000 ppm, about 100 ppm to about 1000 ppm, about 100 ppm to about 500 ppm, about 200 ppm to about 5000 ppm, about 200 ppm to about 4000 ppm, about 200 ppm to about 3000 ppm, about 200 ppm to about 2000 ppm, about 200 ppm to about 1000 ppm, about 200 ppm to about 500 ppm, about 300 ppm to about 5000 ppm, about 300 ppm to about 4000 ppm, about 300 ppm to about 3000 ppm, about 300 ppm to about 2000 ppm, about 300 ppm to about 1000 ppm, about 300 ppm to about 500 ppm, about 400 ppm to about 5000 ppm, about 400 ppm to about 4000 ppm, about 400 ppm to about 3000 ppm, about 400 ppm to about 2000 ppm, about 400 ppm to about 1000 ppm, about 400 ppm to about 500 ppm, about 500 ppm to about 5000 ppm, about 500 ppm to about 4000 ppm, about 500 ppm to about 3000 ppm, about 500 ppm to about 2000 ppm, or about 500 ppm to about 1000 ppm. In some embodiments, the polishing composition comprises about 100 ppm to about 5000 ppm of the amine-based compound. In certain embodiments, the polishing composition comprises about 100 ppm to about 3000 ppm of the amine-based compound. In preferred embodiments, the polishing composition comprises about 100 ppm to about 2000 ppm of the amine-based compound.

The polishing composition optionally comprises a buffer. In some embodiments, the polishing composition comprises a buffer. In other embodiments, the polishing composition does not contain a buffer. The buffer, when present, can be any suitable compound capable of adjusting and buffering the pH of the polishing composition. In some embodiments, the buffer is selected from the group consisting of alkyl amines, ammonium salts, alkali metal salts, carboxylic acids, alkali metal nitrates, alkali metal carbonates, alkali metal bicarbonates, borates, and mixtures thereof. In certain embodiments, the buffer is an alkali metal salt (e.g., a potassium salt). For example, the buffer can be an alkali metal (e.g., lithium, sodium, potassium, rubidium, or cesium) carbonate, acetate, cyanide, sulfide, bicarbonate, metasilicate, etc. In preferred embodiments, the buffer is a potassium salt such as, for example, potassium carbonate, potassium bicarbonate, or a combination thereof.

The buffer can be present in the polishing composition in any suitable amount. The polishing composition can comprise about 5000 ppm or less of the buffer, e.g., about 4000 ppm or less, about 3000 ppm or less, about 2000 ppm or less, about 1000 ppm or less, or about 500 ppm or less. Alternatively, or in addition, the polishing composition can comprise about 0 ppm or more of the buffer, e.g., about 50 ppm or more, about 100 ppm or more, about 200 ppm or more, about 300 ppm or more, about 400 ppm or more, or about 500 ppm or more. Thus, the polishing composition can comprise the buffer in an amount bounded by any two of the aforementioned endpoints, as appropriate.

For example, in some embodiments, the buffer can be present in the polishing composition in an amount of about 0 ppm to about 5000 ppm, e.g., about 0 ppm to about 4000 ppm, about 0 ppm to about 3000 ppm, about 0 ppm to about 2000 ppm, about 0 ppm to about 1000 ppm, about 0 ppm to about 500 ppm, about 50 ppm to about 5000 ppm, about 50 ppm to about 4000 ppm, about 50 ppm to about 3000 ppm, about 50 ppm to about 2000 ppm, about 50 ppm to about 1000 ppm, about 50 ppm to about 500 ppm, about 100 ppm to about 5000 ppm, about 100 ppm to about 4000 ppm, about 100 ppm to about 3000 ppm, about 100 ppm to about 2000 ppm, about 100 ppm to about 1000 ppm, about 100 ppm to about 500 ppm, about 200 ppm to about 5000 ppm, about 200 ppm to about 4000 ppm, about 200 ppm to about 3000 ppm, about 200 ppm to about 2000 ppm, about 200 ppm to about 1000 ppm, about 200 ppm to about 500 ppm, about 300 ppm to about 5000 ppm, about 300 ppm to about 4000 ppm, about 300 ppm to about 3000 ppm, about 300 ppm to about 2000 ppm, about 300 ppm to about 1000 ppm, about 300 ppm to about 500 ppm, about 400 ppm to about 5000 ppm, about 400 ppm to about 4000 ppm, about 400 ppm to about 3000 ppm, about 400 ppm to about 2000 ppm, about 400 ppm to about 1000 ppm, about 400 ppm to about 500 ppm, about 500 ppm to about 5000 ppm, about 500 ppm to about 4000 ppm, about 500 ppm to about 3000 ppm, about 500 ppm to about 2000 ppm, or about 500 ppm to about 1000 ppm. In some embodiments, the polishing composition comprises a buffer at a concentration of about 50 ppm to about 5000 ppm. In certain embodiments, the polishing composition comprises about 100 ppm to about 3000 ppm of the buffer.

The polishing composition comprises an aqueous carrier. The aqueous carrier comprises water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N,N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The polishing composition can comprise one or more compounds capable of adjusting (i.e., that adjust) the pH of the polishing composition (i.e., pH adjusting compounds) in addition to the buffer. For example, the pH of the polishing composition can adjusted with a compound capable of adjusting the pH, and subsequently buffered with the buffer. In some embodiments, the buffer and the pH adjusting compound are one in the same. In other embodiments, the pH adjusting compound and the buffer are different. The pH of the polishing composition can be adjusted using any suitable compound capable of adjusting the pH of the polishing composition (e.g., by including an alkali metal hydroxide such as, for example, potassium hydroxide). The pH adjusting compound desirably is water-soluble and compatible with the other components of the polishing composition.

Typically, the chemical-mechanical polishing composition has a pH of about 9 to about 12 at the point-of-use (e.g., a pH of about 9.5 to about 12, about 10 to about 12, about 10.5 to about 12, about 11 to about 12, about 9.5 to about 11.5, about 10 to about 11.5, about 10.5 to about 11.5, about 9.5 to about 11, about 10 to about 11, about 10.5 to about 11.5, or about 11 to about 12). In some embodiments, the polishing composition has a pH of about 9 to about 12 at the point-of-use. In certain embodiments, the polishing composition has a pH of about 10 to about 12 at the point-of-use. Preferably, the polishing composition has a pH of about 10 to about 11 at the point-of-use.

In some embodiments, the polishing composition further comprises a complexing agent (i.e., a chelator). For example, the polishing composition can further comprise a silica chelator such as an aminophosphonic acid. Without wishing to be bound by any particular theory, it is believed that the aminophosphonic acid acts as a silica chelator and thereby increases the polysilicon polishing rate in certain compositions. The silica chelator may include any suitable aminophosphonic acid such as, for example, ethylenediamine tetra(methylene phosphonic acid), amino tri(methylene phosphonic acid), diethylenetriamine penta(methylene phosphonic acid), salts thereof, and combinations thereof. In certain embodiments, the aminophosphonic acid is amino tri(methylene phosphonic acid). For example, the aminophosphonic acid can be DEQUEST™ 2000, commercially available from ThermPhos International.

The complexing agent can be present in the polishing composition in any suitable amount. The polishing composition can comprise about 5000 ppm or less of the complexing agent, e.g., about 4000 ppm or less, about 3000 ppm or less, about 2000 ppm or less, about 1000 ppm or less, or about 500 ppm or less. Alternatively, or in addition, the polishing composition can comprise about 10 ppm or more of the complexing agent, e.g., about 50 ppm or more, about 100 ppm or more, about 200 ppm or more, about 300 ppm or more, about 400 ppm or more, or about 500 ppm or more. Thus, the polishing composition can comprise the complexing agent in an amount bounded by any two of the aforementioned endpoints, as appropriate.

For example, in some embodiments, the complexing agent can be present in the polishing composition in an amount of about 10 ppm to about 5000 ppm, e.g., about 10 ppm to about 4000 ppm, about 10 ppm to about 3000 ppm, about 10 ppm to about 2000 ppm, about 10 ppm to about 1000 ppm, about 10 ppm to about 500 ppm, about 50 ppm to about 5000 ppm, about 50 ppm to about 4000 ppm, about 50 ppm to about 3000 ppm, about 50 ppm to about 2000 ppm, about 50 ppm to about 1000 ppm, about 50 ppm to about 500 ppm, about 100 ppm to about 5000 ppm, about 100 ppm to about 4000 ppm, about 100 ppm to about 3000 ppm, about 100 ppm to about 2000 ppm, about 100 ppm to about 1000 ppm, about 100 ppm to about 500 ppm, about 200 ppm to about 5000 ppm, about 200 ppm to about 4000 ppm, about 200 ppm to about 3000 ppm, about 200 ppm to about 2000 ppm, about 200 ppm to about 1000 ppm, about 200 ppm to about 500 ppm, about 300 ppm to about 5000 ppm, about 300 ppm to about 4000 ppm, about 300 ppm to about 3000 ppm, about 300 ppm to about 2000 ppm, about 300 ppm to about 1000 ppm, about 300 ppm to about 500 ppm, about 400 ppm to about 5000 ppm, about 400 ppm to about 4000 ppm, about 400 ppm to about 3000 ppm, about 400 ppm to about 2000 ppm, about 400 ppm to about 1000 ppm, about 400 ppm to about 500 ppm, about 500 ppm to about 5000 ppm, about 500 ppm to about 4000 ppm, about 500 ppm to about 3000 ppm, about 500 ppm to about 2000 ppm, or about 500 ppm to about 1000 ppm. In some embodiments, the polishing composition comprises about 50 ppm to about 1000 ppm of the complexing agent.

The chemical-mechanical polishing composition optionally further comprises one or more additives. Illustrative additives include conditioners, acids (e.g., sulfonic acids), biocides, scale inhibitors, and dispersants.

A biocide, when present, can be any suitable biocide and can be present in the polishing composition in any suitable amount. A suitable biocide is an isothiazolinone (e.g., a methylisothiazolinone or a benzisothiazolinone) biocide or the like. The biocide can be present in the polishing composition at a concentration of about 1 ppm to about 750 ppm, preferably about 20 ppm to about 200 ppm.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., silica abrasive, amine-based compound, optional buffer, and/or any other optional additives) as well as any combination of ingredients (e.g., silica abrasive, amine-based compound, optional buffer, and/or any other optional additives, etc.).

For example, the polishing composition can be prepared by (i) providing all or a portion of the liquid carrier, (ii) dispersing the silica abrasive, amine-based compound, optional buffer, and/or any other optional additive, using any suitable means for preparing such a dispersion, (iii) adjusting the pH of the dispersion as appropriate (e.g., by including an alkali metal hydroxide such as, for example, potassium hydroxide), and (iv) optionally adding suitable amounts of any other optional components and/or additives to the mixture.

The polishing composition can be supplied as a one-package system comprising the silica abrasive, amine-based compound, optional buffer, and/or any other optional additives, and water. Alternatively, the polishing composition of the invention can be supplied as a two-package system comprising an abrasive slurry in a first package and an additive solution in a second package, wherein the abrasive slurry consists essentially of, or consists of, abrasive particles, and water, and wherein the additive solution consists essentially of, or consists of, the amine-based compound, optional buffer, and/or any other optional additive. The two-package system allows for the adjustment of polishing composition characteristics by changing the blending ratio of the two packages, i.e., the abrasive slurry and the additive solution.

Various methods can be employed to utilize such a two-package polishing system. For example, the abrasive slurry and additive solution can be delivered to the polishing table by different pipes that are joined and connected at the outlet of supply piping. The abrasive slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 seconds or less, about 30 seconds or less, about 10 seconds or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the silica abrasive, amine-based compound, optional buffer, and/or any other optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the silica abrasive, amine-based compound, optional buffer, and/or any other optional additive are at least partially or fully dissolved in the concentrate.

The invention further provides a method of chemically-mechanically polishing a substrate comprising, consisting essentially of, or consisting of: (i) providing a substrate, (ii) providing a polishing pad, (iii) providing a chemical-mechanical polishing composition comprising: (a) silica abrasive; (b) an amine-based compound, wherein the amine-based compound comprises a carbon to nitrogen ratio of about 1:1 to about 3:1; (c) optionally a buffer; and (d) water, wherein the polishing composition has a pH of about 9 to about 12, (iv) contacting the substrate with the polishing pad and the chemical-mechanical polishing composition, and (v) moving the polishing pad and the chemical-mechanical polishing composition relative to the substrate to abrade at least a portion of a surface of the substrate to thereby polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, or combinations thereof. The method of the invention is particularly useful for polishing substrates comprising polysilicon, e.g., any one or all of the aforementioned materials. In some embodiments, the substrate comprises polysilicon on a surface of the substrate, and at least a portion of the polysilicon on a surface of the substrate is abraded to polish the substrate.

In some embodiments, the substrate comprises silicon oxide, silicon nitride, polysilicon, or combinations thereof. The polysilicon can be any suitable polysilicon, many of which are known in the art. The polysilicon can have any suitable phase, and can be amorphous, crystalline, or a combination thereof. The silicon nitride can be any suitable silicon nitride, many of which are known in the art. The silicon nitride can have any suitable phase, and can be amorphous, crystalline, or a combination thereof. The silicon oxide similarly can be any suitable silicon oxide, many of which are known in the art. Suitable types of silicon oxide include but are not limited to borophosphosilicate glass (BPSG), high density plasma (HDP) oxides and/or plasma-enhanced tetraethyl ortho silicate (PETEOS) and/or tetraethyl orthosilicate (TEOS), thermal oxide, and undoped silicate glass. In certain embodiments, the substrate comprises polysilicon as well as silicon oxide and/or silicon nitride.

The chemical-mechanical polishing composition of the invention can be tailored to provide effective polishing at the desired polishing ranges selective to specific thin layer materials, while at the same time minimizing surface imperfections, defects, corrosion, erosion and the removal of stop layers. The selectivity can be controlled, to some extent, by altering the relative concentrations of the components of the polishing composition. As used herein, the term "selectivity" refers to the removal rate ratio of two different targeted materials. For example, the selectivity can refer to the removal rate ratios of two different materials or the removal rate ratios of two different topographies (e.g., blanket removal vs. active removal).

In some embodiments, the substrate comprises polysilicon on a surface of the substrate, wherein at least a portion of the polysilicon on a surface of the substrate is abraded at a polysilicon removal rate to polish the substrate, and the substrate further comprises silicon oxide on a surface of the substrate, wherein at least a portion of the silicon oxide on a surface of the substrate is abraded at a silicon oxide removal rate to polish the substrate. Generally, the chemical-mechanical polishing composition provides a polysilicon removal rate which is significantly higher than the silicon oxide removal rate. Thus, in some embodiments, the chemical-mechanical polishing composition comprising: (a) silica abrasive; (b) an amine-based compound, wherein the amine-based compound comprises a carbon to nitrogen ratio of about 1:1 to about 3:1; (c) optionally a buffer; and (d) water, provides a polysilicon removal rate that is at about 25 times greater (e.g., at least 50 times greater, at least 75 time greater, or at least 100 times greater) than the silicon oxide removal rate. In some embodiments, the polysilicon removal rate is least about 50 times greater than the silicon oxide removal rate. In certain embodiments, the polysilicon removal rate is at least about 75 times greater than the silicon oxide removal rate. In preferred embodiments, the polysilicon removal rate is at least about 100 times greater than the silicon oxide removal rate.

In some embodiments, the substrate comprises polysilicon on a surface of the substrate, wherein at least a portion of the polysilicon on a surface of the substrate is abraded at a polysilicon removal rate to polish the substrate, and the substrate further comprises silicon nitride on a surface of the substrate, wherein at least a portion of the silicon nitride on a surface of the substrate is abraded at a silicon nitride removal rate to polish the substrate. Generally, the chemical-mechanical polishing composition provides a polysilicon removal rate which is significantly higher than the silicon nitride removal rate. Thus, in some embodiments, the chemical-mechanical polishing composition comprising: (a) silica abrasive; (b) an amine-based compound, wherein the amine-based compound comprises a carbon to nitrogen ratio of about 1:1 to about 3:1; (c) optionally a buffer; and (d) water, provides a polysilicon removal rate that is at about 25 times greater (e.g., at least 50 times greater, at least 75 time greater, or at least 100 times greater) than the silicon nitride removal rate. In some embodiments, the polysilicon removal rate is least about 50 times greater than the silicon nitride removal rate. In certain embodiments, the polysilicon removal rate is at least about 75 times greater than the silicon nitride removal rate. In preferred embodiments, the polysilicon removal rate is at least about 100 times greater than the silicon nitride removal rate.

In some embodiments, the substrate comprises polysilicon on a surface of the substrate, wherein at least a portion of the polysilicon on a surface of the substrate is abraded at a polysilicon removal rate to polish the substrate, and the substrate further comprises silicon oxide and silicon nitride on a surface of the substrate, wherein at least a portion of the silicon oxide on a surface of the substrate is abraded at a silicon oxide removal rate and wherein at least a portion of the silicon nitride on a surface of the substrate is abraded at a silicon nitride removal rate, to polish the substrate. Generally, the chemical-mechanical polishing composition provides a polysilicon removal rate which is significantly higher than the silicon oxide and silicon nitride removal rates. Thus, in some embodiments, the chemical-mechanical polishing composition comprising: (a) silica abrasive; (b) an amine-based compound, wherein the amine-based compound comprises a carbon to nitrogen ratio of about 1:1 to about 3:1; (c) optionally a buffer; and (d) water, provides a polysilicon removal rate that is at about 25 times greater (e.g., at least 50 times greater, at least 75 time greater, or at least 100 times greater) than the silicon oxide and silicon nitride removal rates. In some embodiments, the polysilicon removal rate is least about 50 times greater than the silicon oxide and silicon nitride removal rates. In certain embodiments, the polysilicon removal rate is at least about 75 times greater than the silicon oxide and silicon nitride removal rates.

The polishing composition of the invention desirably exhibits low particle defects when polishing a substrate, as determined by suitable techniques. Particle defects on a substrate polished with the inventive polishing composition can be determined by any suitable technique. For example, laser light scattering techniques, such as dark field normal beam composite (DCN) and dark field oblique beam composite (DCO), or scanning electron microscopy (SEM) analysis can be used to determine particle defects on polished substrates. Suitable instrumentation for evaluating particle defectivity is available from, for example, KLA-Tencor (e.g., SURFSCAN™ SPI instruments operating at a 120 nm threshold or at 160 nm threshold).

A substrate (e.g., silicon oxide, silicon nitride, polysilicon, or a combination thereof), especially silicon comprising polysilicon and silicon oxide and/or silicon nitride, polished with the inventive polishing composition desirably has a DCN value of about 20,000 counts or less, for example, about 17,500 counts or less, about 15,000 counts or less, about 12,500 counts or less, about 3500 counts or less, about 3000 counts or less, about 2500 counts or less, about 2000 counts or less, about 1500 counts or less, or about 1000 counts or less. Preferably substrates polished in accordance with an embodiment of the invention have a DCN value of about 750 counts or less, for example, about 500 counts or less, about 250 counts or less, about 125 counts or less, or even about 100 counts or less.

Alternatively, or in addition, a substrate polished with the chemical-mechanical polishing composition of the invention desirably exhibits low scratches as determined by suitable techniques. For example, silicon wafers polished in accordance with an embodiment of the invention desirably have about 250 scratches or less, about 125 scratches or less, about 100 scratches or less, about 75 scratches or less, about 50 scratches or less, or event about 25 scratches or les, as determined by any suitable method known in the art such as, e.g., laser light scattering or scanning electron microscopy (SEM) analysis of the film.

In some embodiments, a rate control agent may be added to reduce defectivity from particles and/or scratch counts. For example, rate control agents such as quaternary amines such as tetraethylammonium hydroxide, benzyltrimethylammonium hydroxide (BTMAH), tetrabutylammonium hydroxide (TBAH) or polypropylene glycol (PPG), polyethylene glycol (PEG) and copolymers of PEG (e.g., Pluronic surfactants) may be added to lower the particle defects and scratch counts. Generally, the rate control agent will lower the polysilicon removal rate slightly, but not affect the removal rates of silicon oxide or silicon nitride. Therefore, the use of a rate control agent to reduce defects may also slightly reduce the selectivity of polysilicon to silicon oxide and silicon nitride.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof. Soft polyurethane polishing pads are particularly useful in conjunction with the inventive polishing method. Typical pads include but are not limited to SURFIN™ 000, SURFIN™ SSW1, SPM3100 Eminess Technologies), POLITEX™ commercially available from Dow Chemical Company (Newark, DE), and POLYPAS™ 27 commercially available from Fujibo (Osaka, JP), and EPIC™ D100 pads or NEX-PLANAR™ E6088 commercially available from Cabot Microelectronics (Aurora, IL). A preferred polishing pad is the rigid, microporous polyurethane pad (IC1010™) commercially available from Dow Chemical.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

EMBODIMENTS (1) In embodiment (1) is presented a chemical-mechanical polishing composition comprising:
(a) silica abrasive;
(b) an amine-based compound, wherein the amine-based compound comprises a carbon to nitrogen ratio of about 1:1 to about 3:1;
(c) optionally a buffer; and
(d) water,
wherein the polishing composition has a pH of about 9 to about 12.

(2) In embodiment (2) is presented the polishing composition of embodiment (1), wherein the polishing composition comprises about 0.001 wt. % to about 10 wt. % of silica abrasive.

(3) In embodiment (3) is presented the polishing composition of embodiment (2), wherein the polishing composition comprises about 0.1 wt. % to about 5 wt. % of silica abrasive.

(4) In embodiment (4) is presented the polishing composition of any one of embodiments (1)-(3), wherein the polishing composition has a pH of about 10 to about 12.

(5) In embodiment (5) is presented the polishing composition of embodiment (4), wherein the polishing composition has a pH of about 10 to about 11.

(6) In embodiment (6) is presented the polishing composition of any one of embodiments (1)-(5), wherein the polishing composition comprises a buffer at a concentration of about 50 ppm to about 5000 ppm.

(7) In embodiment (7) is presented the polishing composition of embodiment (6), wherein the polishing composition comprises about 100 ppm to about 3000 ppm of the buffer.

(8) In embodiment (8) is presented the polishing composition of any one of embodiments (1)-(7), wherein the polishing composition further comprises a complexing agent.

(9) In embodiment (9) is presented the polishing composition of embodiment (8), wherein the polishing composition comprises about 50 ppm to about 1000 ppm of the complexing agent.

(10) In embodiment (10) is presented the polishing composition of any one of embodiments (1)-(9), wherein the amine-based compound comprises a carbon to nitrogen ratio of about 1:1 to about 2:1.

(11) In embodiment (11) is presented the polishing composition of embodiment (10), wherein the amine-based compound comprises a carbon to nitrogen ratio of about 1.2:1 to about 1.8:1.

(12) In embodiment (12) is presented the polishing composition of any one of embodiments (1)-(9), wherein the amine-based compound comprises a carbon to nitrogen ratio of about 2:1 to about 3:1.

(13) In embodiment (13) is presented the polishing composition of any one of embodiments (1)-(12), wherein the amine-based compound has a molecular weight of about 80 g/mol to about 400 g/mol.

(14) In embodiment (14) is presented the polishing composition of embodiment (13), wherein the amine-based compound has a molecular weight of about 100 g/mol to about 300 g/mol.

(15) In embodiment (15) is presented the polishing composition of embodiment (14), wherein the amine-based compound has a molecular weight of about 120 g/mol to about 250 g/mol.

(16) In embodiment (16) is presented the polishing composition of any one of embodiments (1)-(15), wherein the amine-based compound comprises at least one ethylenediamine subunit.

(17) In embodiment (17) is presented the polishing composition of embodiment (16), wherein the amine-based compound comprises at least two ethylenediamine subunits.

(18) In embodiment (18) is presented the polishing composition of embodiment (17), wherein the amine-based compound comprises at least three ethylenediamine subunits.

(19) In embodiment (19) is presented the polishing composition of any one of embodiments (1)-(18), wherein the amine-based compound consists of carbon, nitrogen, and hydrogen atoms.

(20) In embodiment (20) is presented the polishing composition of any one of embodiments (1)-(9), wherein the amine-based compound is selected from ethylenediamine, diethylenetriamine, triethylenetetramine, tetraethylenepentamine, pentaethylenehexamine, hexaethyleneheptamine, heptaethyleneoctylamine, octaethylenenonylamine, tris(2-aminoethyl)amine, piperazine, homopiperazine, N,N-diethylethylenediamine, 1,3-diamino-2-propanol, N,N,N',N'',N''-pentamethyldiethylenetriamine, N,N'-dimethylethylenediamine, N,N-dimethylethylenediamine, 1-(2-aminoethyl)piperazine, 1,4-bis(3-aminopropyl)piperazine, aminoethylpiperazine, and combinations thereof.

(21) In embodiment (21) is presented the polishing composition of any one of embodiments (1)-(20), wherein the polishing composition comprises about 100 ppm to about 5000 ppm of the amine-based compound.

(22) In embodiment (22) is presented the polishing composition of embodiment (21), wherein the polishing composition comprises about 100 ppm to about 3000 ppm of the amine-based compound.

(23) In embodiment (23) is presented the polishing composition of embodiment (22), wherein the polishing composition comprises about 100 ppm to about 2000 ppm of the amine-based compound.

(24) In embodiment (24) is presented a method of chemically-mechanically polishing a substrate comprising:
(i) providing a substrate,
(ii) providing a polishing pad,
(iii) providing a chemical-mechanical polishing composition comprising:
(a) silica abrasive;
(b) an amine-based compound, wherein the amine-based compound comprises a carbon to nitrogen ratio of about 1:1 to about 3:1;
(c) optionally a buffer; and
(d) water,
wherein the polishing composition has a pH of about 9 to about 12,
(iv) contacting the substrate with the polishing pad and the chemical-mechanical polishing composition, and
(v) moving the polishing pad and the chemical-mechanical polishing composition relative to the substrate to abrade at least a portion of a surface of the substrate to thereby polish the substrate.

(25) In embodiment (25) is presented the method of embodiment (24), wherein the polishing composition comprises about 0.001 wt. % to about 10 wt. % of silica abrasive.

(26) In embodiment (26) is presented the method of embodiment (25), wherein the polishing composition comprises about 0.1 wt. % to about 5 wt. % of silica abrasive.

(27) In embodiment (27) is presented the method of any one of embodiments (24)-(26), wherein the polishing composition has a pH of about 10 to about 12.

(28) In embodiment (28) is presented the method of embodiment (27), wherein the polishing composition has a pH of about 10 to about 11.

(29) In embodiment (29) is presented the method of any one of embodiments (24)-(28), wherein the polishing composition comprises a buffer at a concentration of about 50 ppm to about 5000 ppm.

(30) In embodiment (30) is presented the method of embodiment (29), wherein the polishing composition comprises about 100 ppm to about 3000 ppm of the buffer.

(31) In embodiment (31) is presented the method of any one of embodiments (24)-(30), wherein the polishing composition further comprises a complexing agent.

(32) In embodiment (32) is presented the method of embodiment (31), wherein the polishing composition comprises about 50 ppm to about 1000 ppm of the complexing agent.

(33) In embodiment (33) is presented the method of any one of embodiments (24)-(32), wherein the amine-based compound comprises a carbon to nitrogen ratio of about 1:1 to about 2:1.

(34) In embodiment (34) is presented the method of embodiment (33), wherein the amine-based compound comprises a carbon to nitrogen ratio of about 1.2:1 to about 1.8:1.

(35) In embodiment (35) is presented the method of any one of embodiments (24)-(32), wherein the amine-based compound comprises a carbon to nitrogen ratio of about 2:1 to about 3:1.

(36) In embodiment (36) is presented the method of any one of embodiments (24)-(35), wherein the amine-based compound has a molecular weight of about 80 g/mol to about 400 g/mol.

(37) In embodiment (37) is presented the method of embodiment (36), wherein the amine-based compound has a molecular weight of about 100 g/mol to about 300 g/mol.

(38) In embodiment (38) is presented the method of embodiment (37), wherein the amine-based compound has a molecular weight of about 120 g/mol to about 250 g/mol.

(39) In embodiment (39) is presented the method of any one of embodiments (24)-(38), wherein the amine-based compound comprises at least one ethylenediamine subunit.

(40) In embodiment (40) is presented the method of embodiment (39), wherein the amine-based compound comprises at least two ethylenediamine subunits.

(41) In embodiment (41) is presented the method of embodiment (40), wherein the amine-based compound comprises at least three ethylenediamine subunits.

(42) In embodiment (42) is presented the method of any one of embodiments (24)-(41), wherein the amine-based compound consists of carbon, nitrogen, and hydrogen atoms.

(43) In embodiment (43) is presented the method of any one of embodiments (24)-(32), wherein the amine-based compound is selected from ethylenediamine, diethylenetriamine, triethylenetetramine, tetraethylenepentamine, pentaethylenehexamine, hexaethyleneheptamine, heptaethyleneoctylamine, octaethylenenonylamine, tris(2-aminoethyl)amine, piperazine, homopiperazine, N,N-diethylethylenediamine, 1,3-diamino-2-propanol, N,N,N',N'',N''-pentamethyldiethylenetriamine, N,N'-dimethylethylenediamine, N,N-dimethylethylenediamine, 1-(2-aminoethyl)piperazine, 1,4-bis(3-aminopropyl)piperazine, aminoethylpiperazine, and combinations thereof.

(44) In embodiment (44) is presented the method of any one of embodiments (24)-(43), wherein the polishing composition comprises about 100 ppm to about 5000 ppm of the amine-based compound.

(45) In embodiment (45) is presented the method of embodiment (44), wherein the polishing composition comprises about 100 ppm to about 3000 ppm of the amine-based compound.

(46) In embodiment (46) is presented the method of embodiment (45), wherein the polishing composition comprises about 100 ppm to about 2000 ppm of the amine-based compound.

(47) In embodiment (47) is presented the method of any one of embodiments (24)-(46), wherein the substrate comprises polysilicon on a surface of the substrate, and wherein at least a portion of the polysilicon on a surface of the substrate is abraded at a polysilicon removal rate to polish the substrate.

(48) In embodiment (48) is presented the method of embodiment (47), wherein the substrate further comprises silicon oxide on a surface of the substrate, and wherein at least a portion of the silicon oxide on a surface of the substrate is abraded at a silicon oxide removal rate to polish the substrate.

(49) In embodiment (49) is presented the method of embodiment (48), wherein the polysilicon removal rate is at least about 50 times greater than the silicon oxide removal rate.

(50) In embodiment (50) is presented the method of embodiment (49), wherein the polysilicon removal rate is at least about 75 times greater than the silicon oxide removal rate.

(51) In embodiment (51) is presented the method of embodiment (50), wherein the polysilicon removal rate is at least about 100 times greater than the silicon oxide removal rate.

(52) In embodiment (52) is presented the method of any one of embodiments (47)-(51), wherein the substrate further comprises silicon nitride on a surface of the substrate, and wherein at least a portion of the silicon nitride on a surface of the substrate is abraded at a silicon nitride removal rate to polish the substrate.

(53) In embodiment (53) is presented the method of embodiment (52), wherein the polysilicon removal rate is at least about 50 times greater than the silicon nitride removal rate.

(54) In embodiment (54) is presented the method of embodiment (53), wherein the polysilicon removal rate is at least about 75 times greater than the silicon nitride removal rate.

(55) In embodiment (55) is presented the method of embodiment (54), wherein the polysilicon removal rate is at least about 100 times greater than the silicon nitride removal rate.

(56) In embodiment (56) is presented the polishing composition or method in any of embodiments (1)-(55) further comprising a rate control agent selected from tetrabutylammonium hydroxide and polypropylene glycol.

EXAMPLES

These following examples further illustrate the invention but, of course, should not be construed as in any way limiting its scope.

The following abbreviations are used throughout the Examples: removal rate (RR); tetraethyl orthosilicate (TEOS); silicon nitride (SiN); polysilicon (polySi); and point of use (POU).

In the following examples, substrates TEOS (i.e., silicon oxide), SiN (i.e., silicon nitride), and/or polySi were coated on patterned wafers, and were polished using either a MIRRA™ (Applied Materials, Inc.) polishing tool, an AP300™ (CTS Co., Ltd) polishing tool, a Logitech™ polishing tool (Logitech, Ltd.), or a REFLEXION™ (Applied Materials, Inc.) polishing tool. An IC 1010™ polishing pad (Rohm and Haas Electronic Materials) or a NEXPLANAR™ E6088 polishing pad (Cabot Microelectronics, Aurora, IL) were used with identical polishing parameters for all compositions. Unless stated otherwise, standard REFLEXION™ polishing parameters are as follows: IC1010™ pad, downforce=13.79 kPa (2 psi), platen speed=100 rpm, total flow rate=200 mL/min Unless stated otherwise, standard Logitech™ polishing parameters are as follows: NEXPLANAR™ E6088 pad, downforce=13.79 kPa (2 psi), platen speed=93 rpm, total flow rate=200 mL/min. Unless stated otherwise, standard AP300™ polishing parameters are as follows: IC1010™ pad, downforce=13.79 kPa (2 psi), platen speed=100 rpm, total flow rate=200 mL/min Unless stated otherwise, standard MIRRA™ polishing parameters are as follows: IC1010™ pad, downforce=13.79 kPa (2 psi), platen speed=93 rpm, total flow rate=200 mL/min or NEXPLANAR™ E6088 pad, downforce=13.79 kPa (2 psi), platen speed=93 rpm, total flow rate=200 mL/min. Removal rates were calculated by measuring the film thickness, using spectroscopic elipsometry, and subtracting the final thickness from the initial thickness.

Example 1

This example demonstrates the effect of an amine-based compound (tris-(2-aminoethyl)-amine (TREN)) comprising a carbon to nitrogen ratio of about 1:1 to about 3:1 on (i) the removal rate of polySi and (ii) the amount of surface defects.

Comparative Polishing Composition 1A was prepared by combining the following components and diluting the composition as needed to provide a point-of-use composition containing: 4430 ppm arginine, 346 ppm DEQUEST™ 2000, 700 ppm KOH, 1161 ppm $KHCO_3$, 13.3 ppm 1,2-benzisothiazolin-3-one (BIT), and 1.75 wt. % silica (Nalco DVSTS006 silica particles).

Inventive Polishing Composition 1B was prepared by combining the following components and diluting the composition as needed to provide a point-of-use composition containing: 222 ppm tris-(2-aminoethyl)-amine (TREN), 346 ppm DEQUEST™ 2000, 700 ppm KOH, 1164 ppm $KHCO_3$, 7 ppm 1,2-benzisothiazolin-3-one (BIT), and 0.88 wt. % silica (Nalco DVSTS006 silica particles).

Separate patterned wafers (e.g., 200 mm or 300 mm diameter wafers) containing polySi, TEOS, or SiN features with a 50% pattern density (approximately 20,000 Å thick features) were coated on patterned silicon substrates having a step-height of approximately 8,000 Å, and were polished on REFLEXION™ tools using a IC1010™ polishing pad at a downforce of 13.79 kPa (2 psi) with Comparative Polishing Composition 1A and Inventive Polishing Composition 1B. The polySi, TEOS, and SiN removal rates were measured and the amount (average) of surface defects and scratches were determined, and the results are set forth in Table 1.

TABLE 1

| | | | Removal Rates and Defect Performance as a Function of Amine-Based Compound | | |
| --- | --- | --- | --- | --- | --- |
| Polishing Composition | polySi RR (Å/min) | TEOS RR (Å/min) | SiN RR (Å/min) | Random Defects | Scratches |
| 1A (Comparative) | 4843 | 80 | 79 | 127 | 110 |
| 1B (Inventive) | ≥7395 | 53 | 79 | 9 | 5 |

As is apparent from the results set forth in Table 1, Inventive Polishing Composition 1B, containing tris-(2-aminoethyl)-amine (TREN), exhibited an increased removal rate of polySi relative to Comparative Polishing Composition 1A, containing arginine, while maintaining similar removal rates of TEOS and SiN, despite having a lower solids (i.e., silica particle) loading. In other words, Inventive Polishing Composition 1B, containing tris-(2-aminoethyl)-amine (TREN), provides higher rate and selectivity for polySi removal than Comparative Polishing Composition 1A, containing arginine, despite having a lower solids (i.e., silica particle) loading. In addition, Inventive Polishing Composition 1B, containing tris-(2-aminoethyl)-amine (TREN), exhibited a significant decrease in surface defects and scratches relative to Comparative Polishing Composition 1A, containing arginine.

Example 2

This example demonstrates the effect of concentration of an amine-based compound (tris-(2-aminoethyl)-amine (TREN)) comprising a carbon to nitrogen ratio of about 1:1 to about 3:1 on the removal rate of polySi.

Inventive Polishing Compositions 2A-2D were prepared by combining the following components and diluting the composition as needed to provide a composition containing: tris-(2-aminoethyl)-amine (TREN), DEQUEST™ 2000, KOH, KHCO₃, 1,2-benzisothiazolin-3-one (BIT), and silica (Nalco DVSTS006 silica particles). The point-of-use concentrations of Inventive Polishing Compositions 2A-2C are as follows: 350 ppm DEQUEST™ 2000, 700 ppm KOH, 1164 ppm KHCO₃, 7 ppm 1,2-benzisothiazolin-3-one (BIT), and 0.88 wt. % silica (Nalco DVSTS006 silica particles). The point-of-use concentrations of Inventive Polishing Composition 2D are as follows: 50 ppm DEQUEST™ 2000, 100 ppm KOH, 166 ppm KHCO₃, 1 ppm 1,2-benzisothiazolin-3-one (BIT), and 0.13 wt. % silica (Nalco DVSTS006 silica particles). The point-of-use concentrations of tris-(2-aminoethyl)-amine (TREN) for each of Polishing Compositions 2A-2D are set forth in Table 2.

Separate patterned wafers (e.g., 200 mm or 300 mm diameter wafers) containing polySi, TEOS, or SiN features with a 50% pattern density (approximately 20,000 Å thick features) were coated on patterned silicon substrates having a step-height of approximately 8,000 Å, and were polished on REFLEXION™ tools using a IC1010™ polishing pad at a downforce of 13.79 kPa (2 psi) with Inventive Polishing Compositions 2A-2D. The polySi, TEOS, and SiN removal rates were measured and the results are set forth in Table 2.

TABLE 2

| | | Removal Rate as a Function of Concentration of Amine-Based Compound | | |
| --- | --- | --- | --- | --- |
| Polishing Composition | TREN (ppm) | polySi RR (Å/min) | TEOS RR (Å/min) | SiN RR (Å/min) |
| 2A (Inventive) | 1400 | 6341 | 24 | 37 |
| 2B (Inventive) | 800 | 5950 | 69 | 52 |
| 2C (Inventive) | 200 | 5166 | 77 | 47 |
| 2D (Inventive) | 200 | 4994 | 61 | 7 |

As is apparent from the results set forth in Table 2, each of Inventive Polishing Compositions 2A-2D, containing tris-(2-aminoethyl)-amine (TREN), exhibited high removal rates of polySi, while maintaining similar removal rates of TEOS and SiN. While the removal rate of polySi decreased slightly as the concentration of tris-(2-aminoethyl)-amine (TREN) was decreased, the Inventive Polishing Compositions were still very effective at maintaining high polySi removal rates, despite low doses of tris-(2-aminoethyl)-amine (TREN) and low solids (i.e., silica particle) loading, as evidenced by Inventive Polishing Compositions 2C and 2D, respectively.

Example 3

This example demonstrates the effect of an amine-based compound comprising a carbon to nitrogen ratio of about 1:1 to about 3:1 on (i) the removal rate of polySi and (ii) the amount of surface defects.

Comparative Polishing Composition 3A was prepared by combining the following components and diluting the composition as needed to provide a point-of-use composition containing: arginine, DEQUEST™ 2000, KOH, KHCO₃, 1,2-benzisothiazolin-3-one (BIT), and silica (Nalco DVSTS006 silica particles).

Inventive Polishing Compositions 3B-3G were prepared by combining tris-(2-aminoethyl)-amine (TREN), triethylenetetramine (TETA), or pentaethylenehexamine (PEHA) with the following components and diluting the composition as needed to provide a composition containing DEQUEST™ 2000, KOH, KHCO₃, 1,2-benzisothiazolin-3-one (BIT), and silica (Nalco DVSTS006 silica particles).

The point-of-use concentrations of Comparative Polishing Composition 3A and Inventive Polishing Compositions 3B-3G are set forth in Table 3.

TABLE 3

| | | Point-of-Use Concentration of Polishing Compositions 3A-3G | | | | |
| --- | --- | --- | --- | --- | --- | --- |
| Polishing Composition | Additive (ppm) | DEQUEST (ppm) | KOH (ppm) | KHCO₃ (ppm) | BIT (ppm) | Solids (wt. %) |
| 3A (Comparative) | arginine (4430) | 346 | 700 | 1160 | 13.3 | 1.75 |
| 3B (Inventive) | TREN (313) | 350 | 700 | 1160 | 7 | 0.88 |
| 3C (Inventive) | TETA (1399) | 350 | 700 | 1160 | 7 | 0.88 |
| 3D (Inventive) | PEHA (313) | 350 | 700 | 1160 | 7 | 0.88 |
| 3E (Inventive) | PEHA (313) | 140 | 290 | 470 | 7 | 0.88 |
| 3F (Inventive) | PEHA (313) | 140 | 290 | 470 | 7 | 1.75 |
| 3G (Inventive) | PEHA (313) | 350 | 700 | 1160 | 7 | 1.75 |

Separate patterned wafers (e.g., 200 mm or 300 mm diameter wafers) containing polySi, TEOS, or SiN features with a 50% pattern density (approximately 20,000 Å thick features) were coated on patterned silicon substrates having a step-height of approximately 8,000 Å, and were polished on REFLEXION™ tools using a IC1010™ polishing pad at a downforce of 13.79 kPa (2 psi) with Comparative Polishing Composition 3A and Inventive Polishing Compositions 3B-3G. The polySi, TEOS, and SiN removal rates were measured and the amount (average) of surface defects and scratches were determined, and the results are set forth in Table 4.

TABLE 4

Removal Rates and Defect Performance
as a Function of Amine-Based Compound

| Polishing Composition | polySi RR (Å/min) | TEOS RR (Å/min) | SiN RR (Å/min) | Random Defects | Scratches |
|---|---|---|---|---|---|
| 3A (Comparative) | 4583 | 50 | 80 | 7031 | 3240 |
| 3B (Inventive) | 5457 | 49 | 129 | 94 | 47 |
| 3C (Inventive) | 7301 | 62 | 138 | 455 | 15 |
| 3D (Inventive) | 5991 | 24 | 46 | 678 | 16 |
| 3E (Inventive) | 5695 | 8 | 55 | 1389 | 13 |
| 3F (Inventive) | 5935 | 16 | 59 | 761 | 17 |
| 3G (Inventive) | 6443 | 55 | 96 | 560 | 20 |

As is apparent from the results set forth in Table 4, Inventive Polishing Compositions 3B-3G, containing TREN, TETA, or PEHA, exhibited an increased removal rate of polySi relative to Comparative Polishing Composition 3A, containing arginine, while maintaining similar removal rates of TEOS and SiN. In other words, Inventive Polishing Compositions 3B-3G, containing TREN, TETA, or PEHA, provide higher rate and selectivity for polySi removal than Comparative Polishing Composition 3A, containing arginine. In addition, Inventive Polishing Compositions 3C-3G, containing TETA or PEHA, exhibited similar potential for improved polishing performance relative to Inventive Polishing Composition 3B, containing TREN.

Example 4

This example demonstrates the effect of an amine-based compound comprising a carbon to nitrogen ratio of about 1:1 to about 3:1 on the removal rate of polySi.

Comparative Polishing Composition 4A was prepared by combining the following components and diluting the composition as needed to provide a point-of-use composition containing: arginine, KOH, KHCO₃, 1,2-benzisothiazolin-3-one (BIT), and silica (Nalco DVSTS006 silica particles).

Inventive Polishing Compositions 4B-4E were prepared by combining tris-(2-aminoethyl)-amine (TREN), triethylenetetramine (TETA), pentaethylenehexamine (PEHA), or homopiperazine with the following components and diluting the composition as needed to provide a composition containing: KOH, KHCO₃, 1,2-benzisothiazolin-3-one (BIT), and silica (Nalco DVSTS006 silica particles).

The point-of-use concentrations of Comparative Polishing Composition 4A and Inventive Polishing Compositions 4B-4E are set forth in Table 5.

TABLE 5

Point-of-Use Concentration of Polishing Compositions 4A-4E

| Polishing Composition | Additive (ppm) | KOH (ppm) | KHCO₃ (ppm) | BIT (ppm) | Solids (wt. %) |
|---|---|---|---|---|---|
| 4A (Comparative) | arginine (4440) | 700 | 1164 | 14 | 1.75 |
| 4B (Inventive) | homopiperazine (960) | 700 | 1164 | 7 | 0.88 |
| 4C (Inventive) | TETA (1400) | 700 | 1164 | 7 | 0.88 |
| 4D (Inventive) | TEPA (1810) | 700 | 1164 | 7 | 0.88 |
| 4E (Inventive) | PEHA (2222) | 700 | 1164 | 7 | 0.88 |

Separate patterned wafers (e.g., 200 mm or 300 mm diameter wafers) containing polySi, TEOS, or SiN features with a 50% pattern density (approximately 20,000 Å thick features) were coated on patterned silicon substrates having a step-height of approximately 8,000 Å, and were polished on MIRRA™ tools using a NEXPLANAR™ E6088 polishing pad at a downforce of 13.79 kPa (2 psi) with Comparative Polishing Composition 4A and Inventive Polishing Compositions 4B-4E. The polySi, TEOS, and SiN removal rates were measured and the results are set forth in Table 6.

TABLE 6

Removal Rates as a Function of Amine-Based Compound

| Polishing Composition | polySi RR (Å/min) | TEOS RR (Å/min) | SiN RR (Å/min) |
|---|---|---|---|
| 4A (Comparative) | 1052 | 56 | 24 |
| 4B (Inventive) | 2577 | 45 | 16 |
| 4C (Inventive) | 3226 | 35 | 19 |
| 4D (Inventive) | 1621 | 35 | 19 |
| 4E (Inventive) | 2076 | 12 | 8 |

As is apparent from the results set forth in Table 6, Inventive Polishing Compositions 4B-4E, containing TETA-, TEPA, PEHA, or homopiperazine, exhibited an increased removal rate of polySi relative to Comparative Polishing Composition 4A, containing arginine, while maintaining similar removal rates of TEOS and SiN. In other words, Inventive Polishing Compositions 4B-4E, containing TETA-, TEPA, PEHA, or homopiperazine, provide higher rate and selectivity for polySi removal than Comparative Polishing Composition 4A, containing arginine.

Example 5

This example demonstrates the effect of an amine-based compound comprising a carbon to nitrogen ratio of about 1:1 to about 3:1 on the removal rate of polySi.

Comparative Polishing Composition 5A and Inventive Polishing Compositions 5B-5O were prepared by combining the following components and diluting the composition as needed to provide a point-of-use composition containing: 14 ppm DEQUEST™ 2000, 280 ppm KOH, 470 ppm KHCO₃, 1.75 wt. % silica (Nalco DVSTS006 silica particles), and 1.3 mM of the amine-based compound additive set forth in Table 7.

Separate patterned wafers (e.g., 200 mm or 300 mm diameter wafers) containing polySi, TEOS, or SiN features with a 50% pattern density (approximately 20,000 Å thick features) were coated on patterned silicon substrates having a step-height of approximately 8,000 Å, and were polished on Logitech™ tools using a NEXPLANAR™ E6088 polishing pad at a downforce of 13.79 kPa (2 psi) with Comparative Polishing Composition 5A and Inventive Polishing Compositions 5B-5O. The polySi, TEOS, and SiN removal rates were measured and the results are set forth in Table 7.

|

TABLE 7

| Polishing Composition | Additive (ppm) | MW (g) | polySi RR (Å/min) | TEOS RR (Å/min) | SiN RR (Å/min) |
|---|---|---|---|---|---|
| | Removal Rates as a Function of Amine-Based Compound | | | | |
| 5A (Comparative) | arginine | 174 | 2899 | 70 | 42 |
| 5B (Inventive) | ethylenediamine | 60 | 2249 | 42 | 27 |
| 5C (Inventive) | diethylenetriamine | 103 | 2820 | 60 | 27 |
| 5D (Inventive) | triethylenetetramine | 146 | 3493 | 38 | 32 |
| 5E (Inventive) | tetraethylenepentamine | 189 | 4044 | 27 | 32 |
| 5F (Inventive) | pentaethylenehexamine | 232 | 3671 | 22 | 19 |
| 5G (Inventive) | N,N-diethylenediamine | 116 | 2550 | 46 | 27 |
| 5H (Inventive) | 1,3-diamino-2-propanol | 90 | 2244 | 31 | 29 |
| 5I (Inventive) | N,N,N',N'',N''-pentamethyldiethylenetriamine | 173 | 1783 | 38 | 26 |
| 5J (Inventive) | N,N'-dimethylethylenediamine | 88 | 2507 | 41 | 25 |
| 5K (Inventive) | N,N-dimethylethylenediamine | 88 | 2588 | 42 | 28 |
| 5L (Inventive) | piperazine | 86 | 2370 | 39 | 28 |
| 5M (Inventive) | homopiperazine | 100 | 2670 | 35 | 29 |
| 5N (Inventive) | 1-(2-aminoethyl)piperazine | 128 | 3241 | 46 | 29 |
| 5O (Inventive) | 1,4-bis(3-aminopropyl)piperazine | 200 | 3876 | 28 | 35 |

As is apparent from the results set forth in Table 7, the polySi removal rate increases as the molecular weight increases when linear ethylenediamine compounds are used. See, for example, Inventive Polishing Compositions 5B-5F. The foregoing trend is also demonstrated by the Figure, which is a graph showing the effect of amine-based compound molecular weight (MW) on the polySi removal rate (Å/min), TEOS removal rate (Å/min), and SiN removal rate for Polishing Compositions 5B-5F. As demonstrated by the Figure, the greatest disparity between the polySi removal rate and the TEOS/SiN removal rates is provided by Inventive Polishing Compositions 5D-5F, containing triethylenetetramine, tetraethylenepentamine, and pentaethylenehexamine, respectively.

Table 7 also shows that Inventive Polishing Composition 5J, containing N,N'-dimethylethylenediamine, and Inventive Polishing Composition 5K, containing N,N-dimethylethylenediamine, provide a polySi removal rate similar to Inventive Polishing Composition 5B, containing ethylenediamine. These results show that converting terminal amines from primary amines to secondary amines or tertiary amines has little effect on performance so long as at least one non-tertiary amine (e.g., primary amine or secondary amine) remains.

Table 7 further shows that Inventive Polishing Composition 5C, containing diethylenetriamine, exhibits a much higher polySi removal rate than Inventive Polishing Composition 5J, containing N,N,N',N'',N''-pentamethyldiethylenetriamine. These results show that primary, secondary, and tertiary amines provide effective polySi removal rates, and that primary and secondary amines in particular can be used to maximize polySi removal rate when desired.

In addition, Table 7 shows that Inventive Polishing Compositions 5L-5O, containing piperazine, homopiperazine, 1-(2-aminoethyl)piperazine, and 1,4-bis(3-aminopropyl)piperazine, respectively, provide a polySi removal rate similar to Inventive Polishing Composition 5B, containing ethylenediamine. These results show that incorporating a methylene group or a hydroxyl group into the amine-containing compound, or making the amine-containing compound cyclic, is not detrimental to polySi removal rate performance.

Example 6

This example demonstrates the effect of using a rate control agent with an amine-based compound comprising a carbon to nitrogen ratio of about 1:1 to about 3:1 on the removal rate of polySi.

All Polishing Compositions contained, at point of use, 313 ppm pentaethylenehexamine (PEHA), 470 ppm potassium hydrogen carbonate (KHCO$_3$), 2.625 wt. % colloidal silica abrasive. Abrasive A had a mean particle size of about 74 nm with a zeta potential of about 42 mV, while abrasive B had a mean particle size of about 106 nm and a zeta potential of about −44 mV. Test wafers were polished on Reflexion® LK tools using a IC1010 polishing pad and a Saeson C1 conditioner at a downforce of 2.5 psi, 97 rpm head speed, 103 rpm platen speed and a flow rate of 250 ml/minute of the test slurries. The rate control agents (RCA) and concentrations of the Polishing Compositions are described in Table 8. Polishing Compositions 6A-6F contained tetrabutylammonium hydroxide (TBAH) and 6G contained polypropylene glycol (PPG) as the RCA. The polySi, TEOS, and SiN removal rates were measured, and the results are set forth in Table 8. Additionally, Random Defect Counts and Scratch Counts were measured by scanning wafers using an SP2 to generate a defect map, using a threshold of 120 nm. Defects were imaged by SEM (Hitachi RS-5500). For the SEM classification, 50 random defects were chosen for imaging and then auto-classified using Klarity software (i.e. particle or scratch defects). Klarity classification was confirmed by an engineer after reviewing the images. Total number of scratches were estimated by taking the percentage of defects in the classified images and multiplying by the total defect count from the SP2. The results are set forth in Table 8.

TABLE 8

| Polishing Comp. | Abrasive (nm) | RCA (ppm) | Poly Si RR (A/min) | TEOS RR (A/min) | SiN RR (A/min) | Random Defect Counts (120 nm) | Scratch Counts (120 nm) |
|---|---|---|---|---|---|---|---|
| | Removal Rates and Defectivity with Rate Control Agents | | | | | | |
| 6A | A (72.9) | 0 | 3356 | 51 | 28 | 85 | 30 |
| 6B | A (73.9) | 200 | 1842 | 47 | 30 | 114 | 19 |
| 6C | A (74.3) | 400 | 1923 | 46 | 30 | ND | ND |

TABLE 8-continued

Removal Rates and Defectivity with Rate Control Agents

| Polishing Comp. | Abrasive (nm) | RCA (ppm) | Poly Si RR (A/min) | TEOS RR (A/ min) | SiN RR (A/ min) | Random Defect Counts (120 nm) | Scratch Counts (120 nm) |
|---|---|---|---|---|---|---|---|
| 6D | B (108.2) | 0 | 482.9 | 31 | 19 | 46 | 17 |
| 6E | B (105.8) | 200 | ND | 35 | ND | 88 | 28 |
| 6F | B (108.4) | 400 | 2862 | 33 | 17 | 33 | 15 |
| 6G | B (103.2) | 100 | 1983 | 28 | 18 | 24 | 4 |

As is apparent from the results set forth in Table 8, the polySi removal rate decreases as the concentration of rate control agent increases. The TEOS and SiN removal rates were not affected by the rate control agent. However, the scratch count decreases with increasing concentrations of rate control agent. Therefore, using a rate control agent with the inventive composition, it is possible to tune the scratch count and polysilicon removal rates.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) silica abrasive;
   (b) an amine-based compound, wherein the amine-based compound comprises a carbon to nitrogen ratio of about 1:1 to about 3:1;
   (c) a rate control agent selected from tetrabutylammonium hydroxide and polypropylene glycol; and
   (d) water,
wherein the polishing composition has a pH of about 9 to about 12, and wherein the polishing composition further comprises about 50 ppm to about 1000 ppm of a complexing agent.

2. The polishing composition of claim 1, wherein the polishing composition comprises about 0.001 wt. % to about 10 wt. % of silica abrasive.

3. The polishing composition of claim 2, wherein the polishing composition comprises about 0.1 wt. % to about 5 wt. % of silica abrasive.

4. The polishing composition of claim 1, wherein the polishing composition has a pH of about 10 to about 11.

5. The polishing composition of claim 1, wherein the amine-based compound comprises a carbon to nitrogen ratio of about 1:1 to about 2:1.

6. The polishing composition of claim 5, wherein the amine-based compound comprises a carbon to nitrogen ratio of about 1.2:1 to about 1.8:1.

7. The polishing composition of claim 1, wherein the amine-based compound comprises a carbon to nitrogen ratio of about 2:1 to about 3:1.

8. The polishing composition of claim 1, wherein the amine-based compound has a molecular weight of about 80 g/mol to about 400 g/mol.

9. The polishing composition of claim 8, wherein the amine-based compound has a molecular weight of about 120 g/mol to about 250 g/mol.

10. The polishing composition of claim 1, wherein the amine-based compound comprises at least one ethylenediamine subunit.

11. The polishing composition of claim 1, wherein the amine-based compound comprises at least three ethylenediamine subunits.

12. The polishing composition of claim 1, wherein the amine-based compound is selected from ethylenediamine, diethylenetriamine, triethylenetetramine, tetraethylenepentamine, pentaethylenehexamine, hexaethyleneheptamine, heptaethyleneoctylamine, octaethylenenonylamine, tris(2-aminoethyl)amine, piperazine, homopiperazine, N,N-diethylethylenediamine, 1,3-diamino-2-propanol, N,N,N',N'', N''-pentamethyldiethylenetriamine, N,N'-dimethylethylenediamine, N,N-dimethylethylenediamine, 1-(2-aminoethyl) piperazine, 1,4-bis(3-aminopropyl) piperazine, aminoethylpiperazine, and combinations thereof.

13. The polishing composition of claim 1, wherein the polishing composition comprises about 100 ppm to about 5000 ppm of the amine-based compound.

* * * * *